United States Patent
Femat Flores et al.

(10) Patent No.: US 10,790,836 B2
(45) Date of Patent: Sep. 29, 2020

(54) SYNCHRONIZER FOR POWER CONVERTERS BASED ON A LIMIT CYCLE OSCILLATOR

(71) Applicant: Instituto Potosino de Investigación Científica y Tecnológica A.C., San Luis Potosí (MX)

(72) Inventors: Alejandro Ricardo Femat Flores, San Luis Potosí (MX); Nimrod Vazquez Nava, Guanajuato (MX); Erick Israel Vazquez Oviedo, San Luis Potosí (MX)

(73) Assignee: Instituto Potosino de Investigacion Cientifica y Tecnologica, AC, San Luis Potos (MX)

( * ) Notice: Subject to any disclaimer, the term of this patent is extended or adjusted under 35 U.S.C. 154(b) by 260 days.

(21) Appl. No.: 15/975,175

(22) Filed: May 9, 2018

(65) Prior Publication Data
US 2018/0331687 A1    Nov. 15, 2018

(30) Foreign Application Priority Data
May 11, 2017    (MX) .................. MX/A/2017/006644

(51) Int. Cl.
*H02J 3/40* (2006.01)
*H03L 7/099* (2006.01)
*H02J 3/38* (2006.01)

(52) U.S. Cl.
CPC .............. *H03L 7/099* (2013.01); *H02J 3/381* (2013.01); *H02J 3/40* (2013.01); *H02J 3/383* (2013.01)

(58) Field of Classification Search
CPC ... H03L 7/099; H02J 3/40; H02J 3/381; H02J 3/383
See application file for complete search history.

(56) References Cited

U.S. PATENT DOCUMENTS 3,319,147 A * 5/1967 Mapham ............... H02M 7/525
                                              363/8
6,370,365 B1 * 4/2002 Callaway, Jr. ......... H03D 7/161
                                              327/113

(Continued)

OTHER PUBLICATIONS

Mostafa A.Abdelkader, "Relaxation Oscillators with Exact Limit Cycles," Journal of Mathematical Analysis and Applications vol. 218, Issue 1, Feb. 1, 1998, pp. 308-312 (Year: 1998).*

(Continued)

*Primary Examiner* — Pinping Sun
(74) *Attorney, Agent, or Firm* — Defillo & Associates, Inc.; Evelyn A Defillo (57) ABSTRACT

The present invention presents a real-time synchronization system for power converters interconnected with the electrical network, whose operation is based on a structurally stable limit cycle oscillator and which develops pure sinusoidal trajectories, creating references free of harmonics and disturbances in network. The proposed invention has the advantage that it has a high degree of immunity and robustness within highly contaminated networks, either due to the presence of harmonics or other types of contamination that may exist in the network, with a better performance than the systems previously reported. Another advantage of the present invention is that regardless of the initial conditions that are established, the system always synchronizes with the signal of the network, guaranteeing a smooth transient from any initial condition to the limit cycle, so it does not require prior tuning. In addition, the proposed scheme does not require Phase-Locked Loop (PLL) or trigonometric functions for synchronization, thus reducing computational time and resources.

4 Claims, 10 Drawing Sheets

(56) References Cited

U.S. PATENT DOCUMENTS

| | | | | |
|---|---|---|---|---|
| 7,750,685 | B1* | 7/2010 | Bunch | H03L 7/087 327/23 |
| 7,898,343 | B1* | 3/2011 | Janesch | H03L 7/087 331/11 |
| 8,067,932 | B2* | 11/2011 | Teodorescu | G01R 19/2513 324/107 |
| 8,472,220 | B2* | 6/2013 | Garrity | H02M 7/4807 363/95 |
| 9,753,067 | B2* | 9/2017 | Deng | G01R 25/00 |
| 2007/0005194 | A1* | 1/2007 | Chang | G01R 19/2513 700/292 |
| 2007/0222529 | A1* | 9/2007 | Carichner | H03L 1/00 331/44 |
| 2010/0213925 | A1 | 8/2010 | Teodorescu et al. | |
| 2013/0070499 | A1* | 3/2013 | Mohajerani | H02M 7/4807 363/126 |
| 2017/0182904 | A1* | 6/2017 | Kvieska | B60L 53/24 |
| 2017/0207789 | A1* | 7/2017 | Czaplewski | H03L 7/24 |
| 2018/0017604 | A1* | 1/2018 | Daw | G01R 31/343 |
| 2019/0163228 | A1* | 5/2019 | Gupta | H03L 7/14 |

OTHER PUBLICATIONS

Kate Burgers, "Finding the Beat in Music: Using Adaptive Oscillators," Harvey Mudd College, 2011, pp. 1-20 (Year: 2011).*

Murali, K., & Lakshmanan, M. (1993), Transmission of signals by synchronization in a chaotic Van der Pol-Duffing oscillator, Physical Review E, R1624-R1626 (1993).

Moukam Kakmeni, F., Bowong, S., Tchawoua, C., & Kaptouom, E. Chaos control and synchronization of a φ6 van der Pol oscillator. Physics Letters A, 305-323 (2004).

Fotsin, H., & Bowong, S. Adaptive control 20 and synchronization of chaotic systems consisting of Van der Pol oscillators coupled to linear oscillators. Chaos, Solitons and Fractals, 822-835 (2006).

Vazquez, S., Sanchez, J., Reyes, M., Leon, J., & Carrasco, J. Adaptive Vectorial Filter for Grid Synchronization of Power Converters Under Unbalanced and/or Distorted Grid Conditions. IEEE Transactions on Industrial Electronics, 1355-1367 (2014).

Oviedo, Erick, Nimrod Vazquez, and Ricardo Femat. Synchronization Technique of Grid-Connected Power Converter-Based on a Limit Cycle Oscillator. IEEE Transactions on Industrial Electronics, 709-717 (2018).

* cited by examiner

SYNCHRONIZER FOR POWER CONVERTERS BASED ON A LIMIT CYCLE OSCILLATOR

FIELD OF THE INVENTION

The instant invention belongs to the electric field, specifically to real time synchronization for power converters interconnected to the electric net.

BACKGROUND OF THE INVENTION

The instant invention discloses a synchronization system for power converters interconected to the electric grid which function is based in a non-linear oxcillator that behaves as a limit cycle oscillator. Generally, in each power convertor conected with the grid, such as active power filters, the Distributed Power Generation Systems (DPGSs), static VAR compensators (VAR), and uninterruptible power supplies (UPSs), needs a phase or frequency tracking system to provide a reference signal in order to synchronize with the grid voltage. In certain applications (e.g.) DPGSs,) it is critical a synchronization system with a high degree of immunity to harmonics unbalances, and power systems disturbances.

In voltage power grids, the waves are sinusoidal and balanced under optimal operating conditions, however, they are susceptible to distortions and imbalances as a consequence of the effect of non-linear loads or to faults in the electrical network; for this reason, equipment connected to the network must be properly synchronized with the variables of the network in such a way that a reliable, efficient and safe connection can be maintained even in non-optimal operating conditions. The information provided by a monitoring system in the electrical network is generally used to monitor its operating conditions, diagnose faults, calculate power flows and translate the state variables of voltages and currents in synchronous reference frames for the correct synchronization of power converters that operate under generic conditions of the electric network.

One of the most important aspects to consider in distributed power generation systems (DPGSs) is the generation and presence of harmonics in the electrical network.

According to what the state of the art describes, different solutions have been proposed to mitigate this problem, such as harmonic compensation using PI (Proportional-Integral) controllers, non-linear controllers or PR (Proportional-Resonant) controllers. Control strategies have also been proposed to correct power grid failures, such as the unit power factor control strategy, the positive sequence control strategy, the constant active power control strategy or the constant reactive power control strategy.

Also, there are different methods of synchronization; which play an important role for the DPGSs. These synchronization methods provide a reference of the voltage of the network, which is used to synchronize the control variables, for example, the current of the DPGSs with the voltage of the electrical network. There are different methods to extract the phase angle of the mains voltage, however these methods introduce a delay in the signal that is being processed; which is unacceptable and poses a challenge for the design of adequate systems for this purpose.

One technique that has gained momentum is the Phase-Locked Loop (PLL) technique. Nowadays, the PLL technique is the most used method to extract the phase angle of the network voltage. PLL technology has been used for many years in different areas such as communications, military and aerospace systems, to synchronize a local oscillator with some recognizable external signal. Thus, the equipment connected to the network conventionally uses a PLL to synchronize its internal control system with the network. In three-phase systems, PLL systems based on a synchronous reference frame (SRF-PLL) have become a conventional synchronization technique. However, the response of the SRF-PLL is poor when the network voltage is unbalanced.

In 1993 (Murali, K., & Lakshmanan, M. (1993), Transmission of signals by synchronization in a chaotic Van der Pol-Duffing oscillator, Physical Review E, R1624-R1626), it had already been established that transmission was possible of analog signals through the synchronization of a chaotic oscillator of limit cycle of the van der pol-duffing type, which are used in the transmission of signals in communication. This document establishes that the robustness of chaos synchronization is clear, so that this principle could be exploited in the transmission of signals for telecommunications.

In 2004 (Moukam Kakmeni, F., Bowong, S., Tchawoua, C., & Kaptouom, E. Chaos control and synchronization of a ϕ6 van der Pol oscillator. Physics Letters A, 305-323) a method of synchronization for a boundary cycle oscillator of the Van der Pol type; This system proved to be adaptable and possess good robustness in the presence of harmonics, however, the Van der Pol oscillator presents deformations in the trajectories of its states, which are a function of a parameter immersed in the system, ie the nature of their trajectories are not pure sinusoids.

US 20100213925 A1 proposed in 2006, a monitoring method for networks, which is functional for one-phase or three-phase systems. The proposed system comprises an harmonic oscillator, Second Order Generalized Integrator (SOGI) interconnected with an FLL module.

The SOGI filters the harmonics that can have in the electrical network and the FLL synchronizes the signal generated by the SOGI in frequency and phase with the electric red. In the three-phase case, the system consists of two fundamental parts, the harmonic detection unit, and a Frequency-Locked Loop (FLL) block; more in detail, a real-time monitoring system is composed of a quadrature wave generator (QSG) and an FLL block that responds to the frequency variations in the monitored signals to modify the tuned frequency of the QSG, in addition to a suspension estimator positive and negative.

Moreover, in 2006 (Fotsin, H., & Bowong, S. (2006). Adaptive control 20 and synchronization of chaotic systems consisting of Van der Pol oscillators coupled to linear oscillators. Chaos, Solitons and Fractals, 822-835), a method for control and synchronization of coupled second order oscillators exhibiting a chaotic behavior was proposed, demonstrating that adaptive control systems can be developed to synchronize the responses of a chaotic oscillator without the need to know the initial conditions of the system. In this way, it is proposed that it is possible to control and synchronize an electrical circuit by means of a limit-cycle oscillator coupled to a linear oscillator, without needing the initial parameters of the system, since the system reaches equilibrium through adaptive control. The application of these synchronization methods is focused on secure communication systems.

Recently, in 2014, (Vazquez, S., Sanchez, J., Reyes, M., Leon, J., & Carrasco, J. Adaptive Vectorial Filter for Grid Synchronization of Power Converters Under Unbalanced and/or Distorted Grid Conditions. IEEE TRANSACTIONS ON INDUSTRIAL ELECTRONICS, 1355-1367), a synchronization system of current converters operating under unbalanced or distorted conditions was proposed. The method presented in this document is based on a series of multiple adaptable vector filters, which are supported by an FLL block so that the method is of adaptive frequency. The implementation of an FLL block has the advantage of estimating the frequency of the input voltage, providing a signal that is not affected by sudden changes, which shows that the use of FLL blocks is more convenient. This system comprises a block with multiple adaptable vector filters (MAVF) and an FLL block, however, unlike the present invention that incorporates a limit cycle oscillator, the system is susceptible to variations in reference amplitude within the range of Normal operation of the electrical network allowed by the IEEE 929 standard, this means that the amplitude of its synchronized signals is not constant within 88%≤V≤110%.

Regardless of the technique used in the monitoring system, the amplitude, frequency, and phase of the monitored variables must be obtained in a fast and adequate manner. In addition, when system monitoring is applied to multiphase, preferably three phase networks, the components of the sequence must be detected quickly and accurately, even when the network voltage is distorted and unbalanced. It is important to note that a real-time monitoring system must be based on a simple algorithm, with low computational load and that can be processed in each period.

In summary, the state of the art has described conventional network monitoring systems based generally on the use of a PLL. This means that the synchronization system estimates the phase angle, either of the voltage in single-phase systems, or of the vector of voltages in three-phase systems. In any case, the phase angle is a very unstable variable under conditions of network failure; additionally, the trigonometric functions are always necessary for the phase angle, which increases the computational load of the monitoring algorithm, making the analysis of the system more complex.

The present invention, unlike the state of the art, describes that the frequency of the network is the variable to be monitored in the system (FLL) which gives a very robust monitoring algorithm because the frequency of the network is much more stable than the network phase, even in fault conditions.

BRIEF DESCRIPTION OF THE INVENTION

Figure 1:
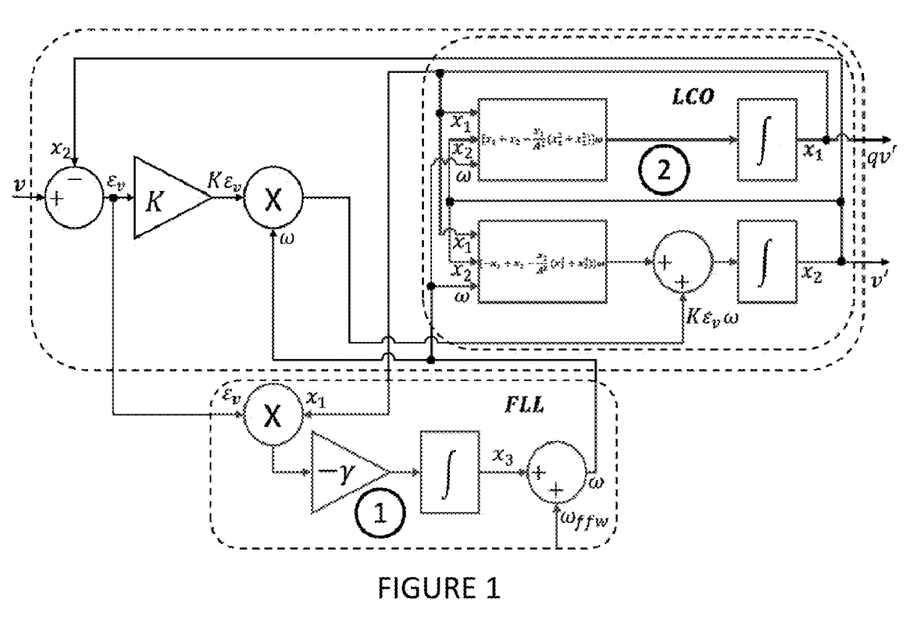
FIG. 1. Block diagram of the synchronization system LCO-FLL of the present invention.

The present invention is a real-time synchronization system for power converters, comprising at least two operating blocks, one of them being a limit cycle oscillator (LCO) (1) operably linked to a Loop Tie block in Frequency (Frequency-locked loop) (FLL) (2), by means of a feedback signal comprising information on the frequency and phase of an input signal. In FIG. 1 a block diagram of the synchronization system of this invention is shown, when applied to a single-phase system.

The LCO is a functional block in charge of generating a pure sinusoidal signal with a specific frequency. The LCO can be understood as the implementation of a filter, however, it is not adaptable to the frequency by itself. Therefore, the system monitoring in this invention uses an FLL frequency loop to keep the LCO set to the frequency and phase of the input signal. An important feature of the invention is that the trajectories of the states of the limit cycle (LCO) that are being proposed, are pure sinusoids, which leads to creating free references of harmonics and disturbances of the electric network, such as amplitude variations, frequency and phase within the normal operating range of the electric network determined by the IEEE 929 standard.

BRIEF DESCRIPTION OF THE FIGURES

FIG. 9. Experimental response of the three-phase LCO-FLL, under voltage distortions and sequence change. (a) Three-phase reference, Ch1: va, Ch2: vb, Ch3: vc. (b) Positive sequence, Ch1: va +, Ch2: vb +, Ch3: vc +. (c) Negative sequence, Ch1: va−, Ch2: vb−, Ch3: vc−. Experimental response of three phase LCO-FLL under distorted voltage conditions. (d) Three-phase reference, Ch1: va, Ch2: vb, Ch3: vc, (e) Positive sequence, Ch1: va +, Ch2: vb +, Ch3: vc +. (f) Negative sequence, Ch1: va−, Ch2: vb−, Ch3: vc−. Experimental response of the three phase LCO-FLL, under an unbalanced reference and distorted voltage, with a negative sequence. (g) Three-phase reference, Ch1: va, Ch2: vb, Ch3: vc, (h) Positive sequence, Ch1: va +, Ch2: vb +, Ch3: vc +. (i) Negative sequence, Ch1: va−, Ch2: vb−, Ch3: vc−(1 V/div-10 ms/div).

DETAILED DESCRIPTION OF THE INVENTION

The present invention is related to real-time monitoring systems of the variables of a single-phase or three-phase network, such as voltage and current. The monitoring and characterization of the voltage of a network and its current parameters is a task of vital importance in most electrical equipment related to power systems interconnected to the electrical network.

The real-time synchronization system for power converters of the present invention comprises at least two blocks, being they a block of a limit-cycle oscillator (LCO) operably linked to a Loop Tie block in Frequency (Frequency-locked loop) (FLL) by means of a feedback signal comprising information on the frequency and phase of an input signal, which converts the system into an adaptive frequency system. In FIG. 1 a schematic diagram of the invention is shown: the device consists of two operational blocks: a limit-cycle oscillator (LCO) (2), and a Frequency-locked loop (FLL) block.) (1).

Figure 2:
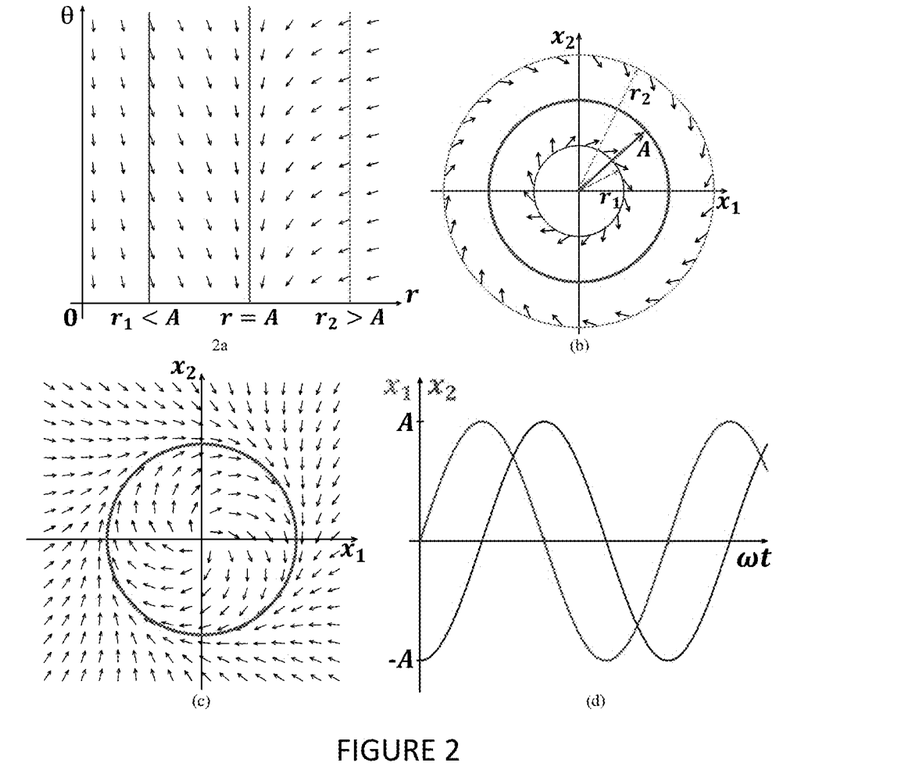
FIG. 2. (a) Direction of the vector field of the limit cycle in its representation in polar coordinates in two surfaces (less and greater than r=A). (b) Direction of the vector field of the limit cycle in its representation in Cartesian coordinates. (c) Portrait phase of the limit cycle. (d) Trajectories in the time of the solutions of the limit cycle.

The LCO is a non-linear oscillator that generates two signals: the signal synchronized to the electrical network and the signal in quadrature, which have a strong attraction towards a limit cycle with sinusoidal trajectories, which leads to create free references of harmonics and disturbances of the electric network. A nonlinear self-sustained sinusoidal oscillator with this property can be represented by the next second order dynamic system in polar coordinates:

$$\dot{r} = \left(1 - \frac{r^2}{A^2}\right) r\omega \quad (1)$$

$$\dot{\theta} = -\omega \quad (2)$$

Where r is the oscillation radius, ω is the angular frequency, and A is the peak amplitude of r. Equation (1a) has three equilibrium points, one of them is unstable in r=0, and two are stables in r=±A. Hereafter, it will be assume that r>0. FIG. 2(a) shows that the entire vector field points to a drain in r=A and the solutions go throughout of it, with a velocity of −ω.

This means that the trajectories of the system (1)-(2) are always attracted to a limit cycle with radius of oscillation r=A.

The system (1)-(2) in Cartesian coordinates is written as:

$$\dot{x}_1 = \left[x_1 + x_2 - \frac{x_1}{A^2}(x_1^2 + x_2^2)\right]\omega \quad (3)$$

$$\dot{x}_2 = \left[-x_1 + x_2 - \frac{x_2}{A^2}(x_1^2 + x_2^2)\right]\omega \quad (4)$$

Where $x_1$ and $x_2$ are the quadrature signal and the signal reference, respectively. The behavior of the vector field over the system (3-4) is depicted in FIG. 2 (b). It is demonstrated by Poincaré-Bendixson Theorem, that (3-4) is a closed orbit and it can be named as LCO, as shown in FIG. 2 (c) where all the vector field points towards the limit cycle, irrespective of initial conditions. Due to the construction of the system (3)-(4), the solutions for their trajectories $x_1$ and $x_2$ are:

$$x1 = -A \cos \omega t \quad (5)$$

$$x2 = A \sin \omega t \quad (6)$$

Which can be seen in FIG. 2 (d) as trajectories for x1 and x2 in a temporal chart.

In the case of a linear harmonic oscillator, there is a continuum of closed orbits, whereas in (3)-(4) there is only one isolated closed orbit. This characteristic makes (3)-(4) structurally stable and robust for perturbations in a highly polluted grid. The most important feature of (3)-(4) is the robustness on initial conditions; in other words, system (3)-(4) guarantee an acceptable transient from any particular initial condition to the limit cycle, as depicted in FIG. 2 (c). Therefore, according to the system of the present invention, the LCO generates a sinusoidal signal synchronized to the input signal creating free references of harmonics and disturbances of the electrical network.

Conventional monitoring systems use PLL for network synchronization. Conventionally, the input stage of a PLL is a phase detector by means of which the phase of the input signal is compared with the phase detected with the PLL. The phase angle is a very unstable variable during network failure conditions, and conventional PLL-based monitoring generates phase errors during network failure conditions.

The Frequency-Locked Loop (FLL) used in the present invention is an effective tool for adapting the center of the frequency, because it collects information about the error in the estimation of the frequency. In conventional PLL-based systems, the phase angle of the network voltage is the main adaptive variable in the detection algorithm. In the real-time synchronization system for power converters based on LCO-FLL of the present invention, the fundamental adaptive variables are not the phase angle of the voltage, but the frequency of the network, which gives great stability to the detection system.

The interconnection between the LCO and the FLL is designed in such a way that the characteristics of both systems are maintained. Therefore, the limit-cycle oscillator (LCO) is operably linked to a Frequency-Locked Loop (FLL) block by means of a feedback signal comprising frequency and phase information. an entry signal. This is achieved by making only the frequency adaptive and indirectly the system phase (3)-(4). The LCO-FLL interconnection is presented below:

$$\begin{bmatrix} \dot{x}_1 = \left[x_1 + x_2 - \frac{x_1}{A^2}(x_1^2 + x_2^2)\right]\omega \\ \dot{x}_2 = k\varepsilon_v\omega + \left[-x_1 + x_2 - \frac{x_2}{A^2}(x_1^2 + x_2^2)\right]\omega \end{bmatrix} \quad (7)$$

$$[\dot{x}_3 = -\gamma\varepsilon_v x_1] \quad (8)$$

Where γ,k are gains, $\omega = x_3 + \omega_{ffw}$ is the angular frequency with $\omega_{ffw}$ as a constant, and the $\varepsilon_v = v - x_2$ is the voltage error signal among a reference v and the signal $x_2$. System (8) is the FLL as the product of the quadrature signal $x_1$ and the voltage error $\varepsilon_v$.

If the reference v (input signal) is chosen as a sinusoidal signal:

$$v = A \sin \theta\text{ref} \quad (9)$$

Which is governed by:

$$\theta\text{ref} = -\omega\text{ref} \quad (10)$$

With $\theta_{ref}$ as the reference phase and $\omega_{ref}$ as the reference angular frequency.

It can be shown that the error εv vanishes as the system (7)-(8) approaches the frequency and oscillation phase of the reference (9).

In this way the system (7)-(8) has the behavior of the limit cycle (3)-(4) oscillating at the frequency and phase of the reference (9), that is, the input signal.

The interconnected system LCO-FLL is shown in block diagram in FIG. 1, where two main outputs of the system can be observed (7)-(8): the quadrature signal qv'=x1 and the signal v'=x2, which is synchronized with the input signal, reference v. Note that the peak amplitude A is a constant, which makes the LCO-FLL system robust against variations in amplitude. This robustness against changes in amplitude complies with the IEEE 929 standard, that is, the amplitude of the synchronized signals of the LCO-FLL are kept constant in front of an input signal with variations in amplitude within the normal operating range of the electrical network (88%≤V≤110%).

The LCO-FLL real-time synchronization system for power converters can be used for three-phase signals, where the synchronization of positive and negative sequence components is achieved from a three-phase LCO-FLL module comprising at least two modules monophasic as those described in FIG. 1.

Figure 3:
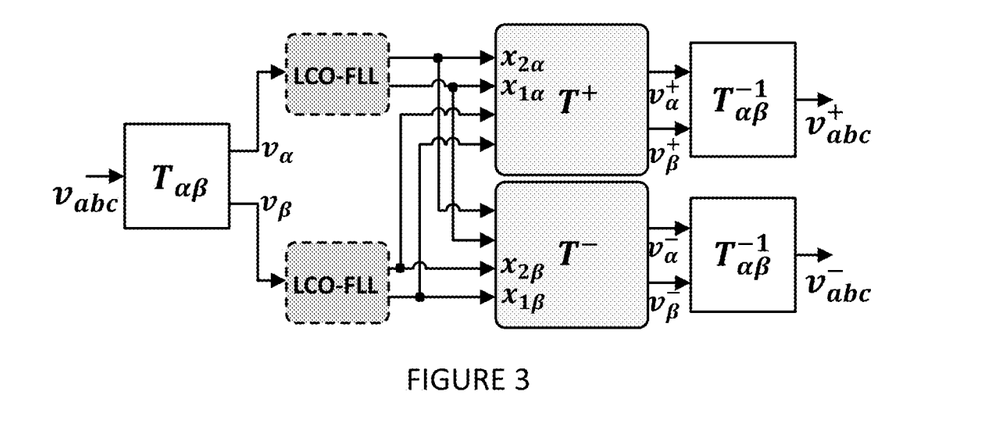
FIG. 3. Block diagram of the three-phase LCO-FLL of the present invention, with the sequence detection of the components.

This three-phase LCO-FLL module is shown in FIG. 3, which consists of a Clarke transformation module Tαβ that is multiplied by the input three-phase vector vatic. The α and β signals are processed by two LCO-FLL modules. After, the synchronized signals and the quadrature signals of the two LCO-FLL modules are multiplied by two sequence matrices positive T+ and negative T−, which are multiplied by two Clarke's inverse transformations. This way you get the components of positive or negative sequence synchronized with the electrical network in its three-phase version:

$$v_{abc}^{-} = [T_{\alpha\beta}^{-1}][T^{-}][LCO-FLL][T_{60\,\beta}]v_{abc} \quad (11)$$

$$v_{abc}^{-} = [T_{\alpha\beta}^{-1}][T^{-}][LCO-FLL][T_{60\,\beta}]v_{abc} \quad (12)$$

Wherein $$[T\alpha\beta] = \sqrt{\frac{2}{3}} \begin{pmatrix} 1 & -1/2 & -1/2 \\ 0 & \sqrt{3}/2 & -\sqrt{3}/2 \end{pmatrix} \quad (13)$$

$$[T_{\alpha\beta}^{-1}] = \sqrt{\frac{2}{3}} \begin{pmatrix} 1 & 0 \\ -1/2 & \sqrt{3}/2 \\ -1/2 & -\sqrt{3}/2 \end{pmatrix} \quad (14)$$

$$[T^{+}] = \frac{1}{2}\begin{pmatrix} 1 & 0 & 0 & -1 \\ 0 & 1 & 1 & 0 \end{pmatrix} \quad (15)$$

$$[T^{-}] = \frac{1}{2}\begin{pmatrix} 1 & 0 & 0 & 1 \\ 0 & -1 & 1 & 0 \end{pmatrix} \quad (16)$$

$$[LCO-FLL] = \begin{pmatrix} 1 & 0 \\ q & 0 \\ 0 & 1 \\ 0 & q \end{pmatrix}, q = e^{f(x/2)} \quad (17)$$

Figure 4:
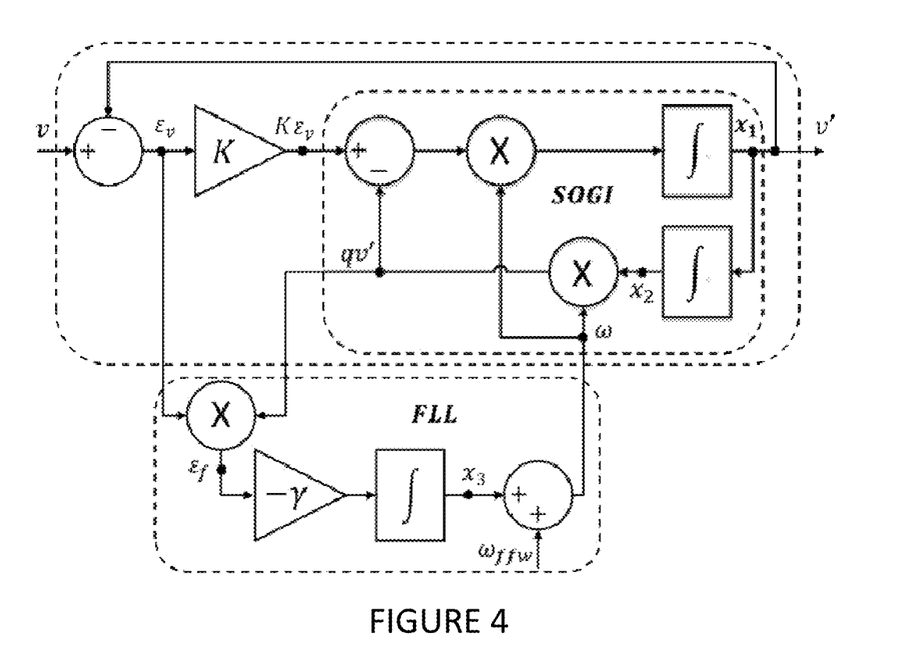
FIG. 4. Block diagram of the SOGI-FLL synchronization system of the state of the art.

To have a point of comparison about the behavior of the LCO-FLL, was compared with a SOGI-FLL synchronization system (FIG. 4).

Both systems, LCO-FLL and SOGI-FLL, were implemented in a National Instruments development card based on a Xilinx Spartan-6 LX45 FPGA at 2.5 MHz. The distorted input signal, in the single-phase and three-phase cases, was generated by a programmable source. The experimental output signals of both systems were taken directly from the Digital Analog Converter (DAC) of the control card.

The real-time synchronization system for power converters may be applicable in a method for synchronizing the current generated by any power producing means, for example, but not limited to: current injection systems to the power grid, interconnection systems, distributed power generation systems, such as, but not limited to, cogeneration and trigeneration energy systems, renewable energy systems, such as photovoltaic systems and wind power systems.

The method to synchronize electrical current involves coupling the power generation system with the electrical network, through a coupling point where current and voltage sensors are implemented that produce the input signal for the real-time synchronization system for power converters. of the present invention. In this way, the electric current generated by any energy producing means, such as those listed above, is synchronized with the electrical network by reference signals that are in phase and frequency to the voltage signals of the electric network to be able to inject active power to the electrical network.

At said point of coupling, the presence of a single-phase or three-phase inverter is necessary, which will process the energy generated by the energy producing means and in turn feed back to the synchronization system of the present invention with voltage and current state signals in order to to synchronize these signals with the voltage signals of the electrical network.

Thus, the real-time synchronization system for power converters of the present invention is useful for injecting electric current in single-phase and three-phase systems to the electric network.

EXAMPLES

Example 1

A test was made to see the trajectory of the transient of both systems. Table I shows the initial conditions and the parameters of the LCO-FLL and the SOGI-FLL, which are the same for both systems. The frequency value of the reference was set at 60 Hz.

TABLE I

Programming parameters of LCO-FLL and SOGI-FLL

| Parameter | Value |
|---|---|
| k, y | 1 |
| wffw | 377 rad/seg |
| (x01, x02, x03) | (10, 10, 10) |
| v (Reference) | sin(377t) |

Figure 5:
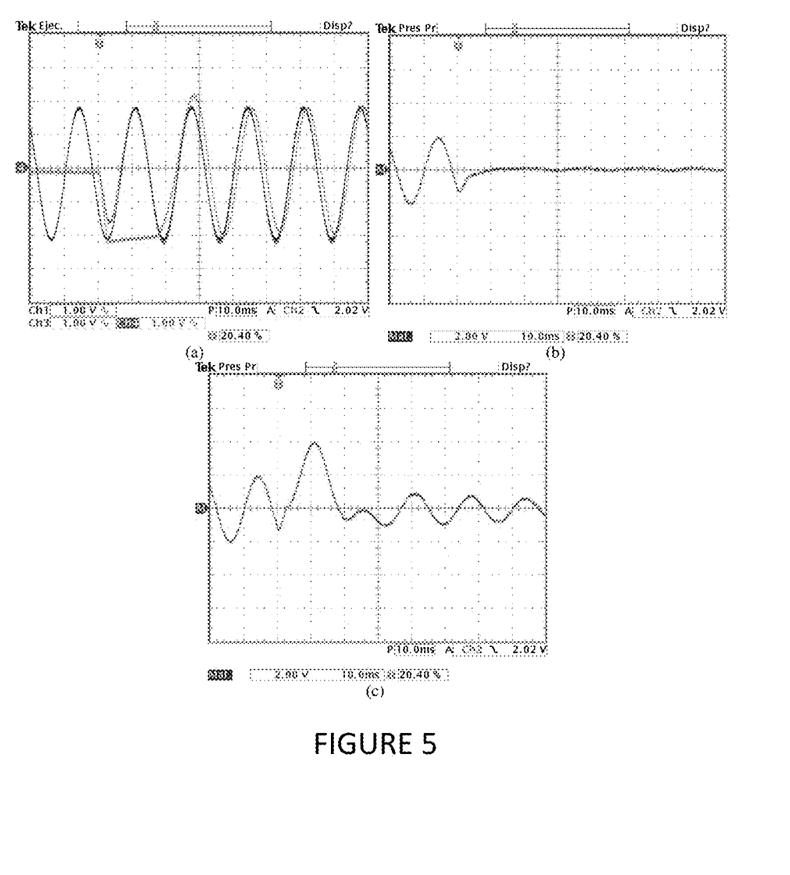
FIG. 5. Behavior of the transient. (a) Ch1. Reference, Ch3: LCO-FLL, Ch4: SOGI-FLL (1V/div-10 ms/div). (b) Voltage error: Ch1-Ch3 (2 V/div-10 ms/div). (c) Voltage error: Ch1-Ch4 (2 V/div-10 ms/div).

The test with the parameters of Table I is shown in FIG. 5 (*a*), in which the trajectories of the reference (Ch1), LCO-FLL (Ch3), and the SOGI-FLL (Ch4) are shown. FIG. 5 (*b*) shows the voltage error between the reference and the LCO-FLL; Here you can see that the transient time to synchronize it with the reference lasts approximately ~9 ms, plus the error is monotonously decreasing. On the other hand, in FIG. 5 (*c*), an overdraft in the voltage error between the reference and the SOGI-FLL is shown before the error begins to decrease, which is an unwanted transition.

Example 2

Figure 6:
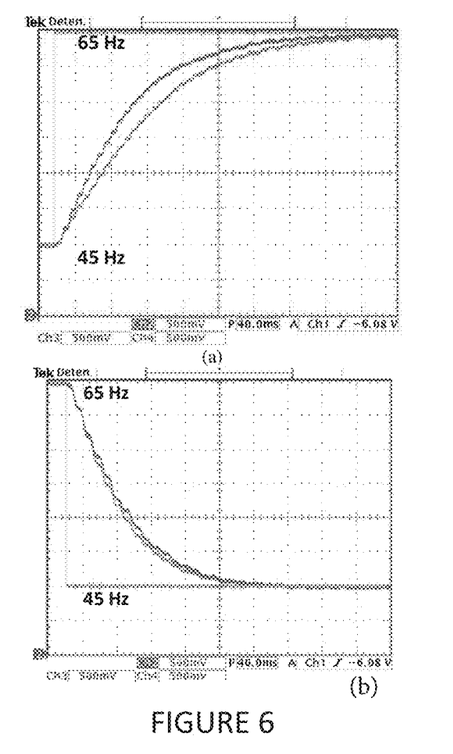
FIG. 6. Experimental response of LCO-FLL and SOGI-FLL under frequency changes. (a) 45 Hz to 65 Hz, Ch2: Reference frequency, Ch3: Frequency of the LCO-FLL signal, Ch4: SOGI-FLL signal frequency (500 mV/div-40 ms/div). (b) 65 Hz to 45 Hz, Ch2: Reference frequency, Ch3: Frequency of the LCO-FLL signal, Ch4: Frequency of the SOGI-FLL signal (500 mV/div-40 ms/div).

This test is performed to compare the transient of the frequency signal for both systems: LCO-FLL and SOGI-FLL, by varying the frequency of the reference. The test was performed as follows: The frequency of the input reference signal (9) changes from 45 Hz to 65 Hz (FIG. 6 (*a*)), and from 65 Hz to 45 Hz (FIG. 6 (*b*)). As can be seen in FIG. 6, the characteristics and advantages of the FLL are preserved after interconnection with the LCO, since the adaptability and dynamic behavior of the transient of the LCO-FLL are similar to that of the SOGI-FLL due to the that use the same frequency adaptation system.

Example 3

Figure 7:
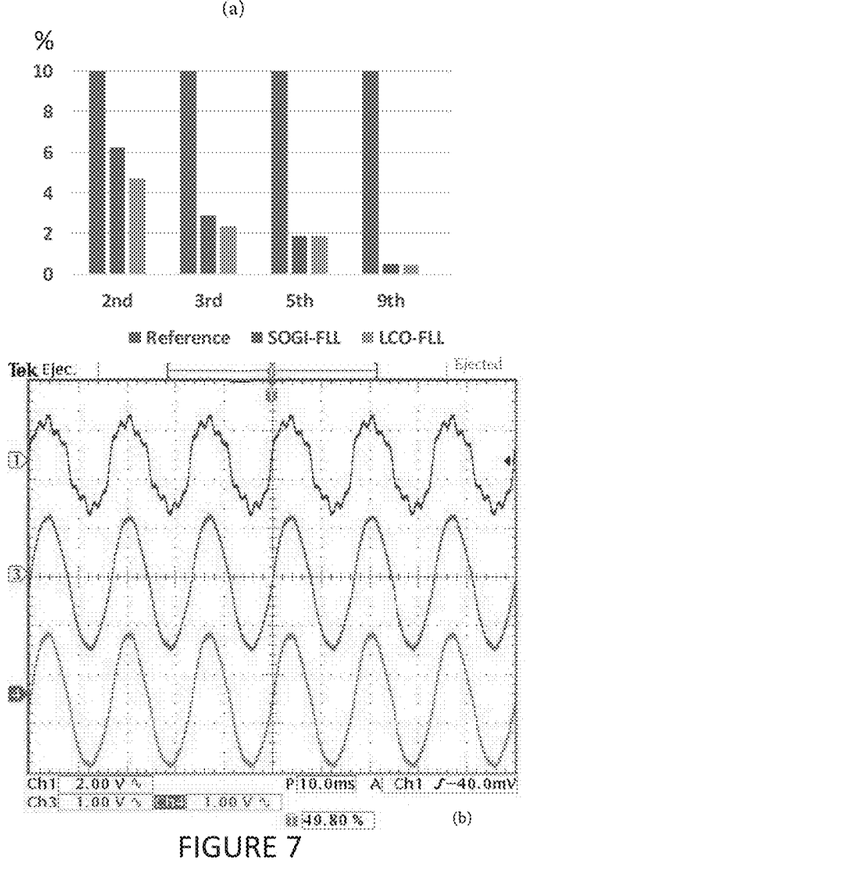
FIG. 7. Experimental response of LCO-FLL and SOGI-FLL under distorted signals. (a) Harmonic percentage table of the input reference, SOGI-FLL and LCO-FLL. (b) Ch1: Reference (1 V/div-4 ms/div), Ch3. LCO-FLL (500 mV/div-4 ms/div), Ch4: SOGI-FLL (500 mV/div-4 ms/div).

This test is performed to observe the performance of both systems against a highly contaminated reference. A highly contaminated input reference was generated with the 2nd, 3rd, 5th, and 9th harmonics, with the percentage indicated in FIG. 7 (a). The total harmonic distortion (THD) of the input voltage is 20%. The behavior of both systems, LCO-FLL and SOGI-FLL can be seen in FIG. 7 (b). Both methods have good filtering characteristics, however the LCO-FLL has a better performance than the SOGI-FLL in terms of the reduction of harmonic disturbances, as can be seen in FIG. 7 (a). In addition, the THD for the LCO-FLL is 5.5%, which is better than the THD of the SOGI-FLL, which was 7.2%.

Example 4

Figure 8:
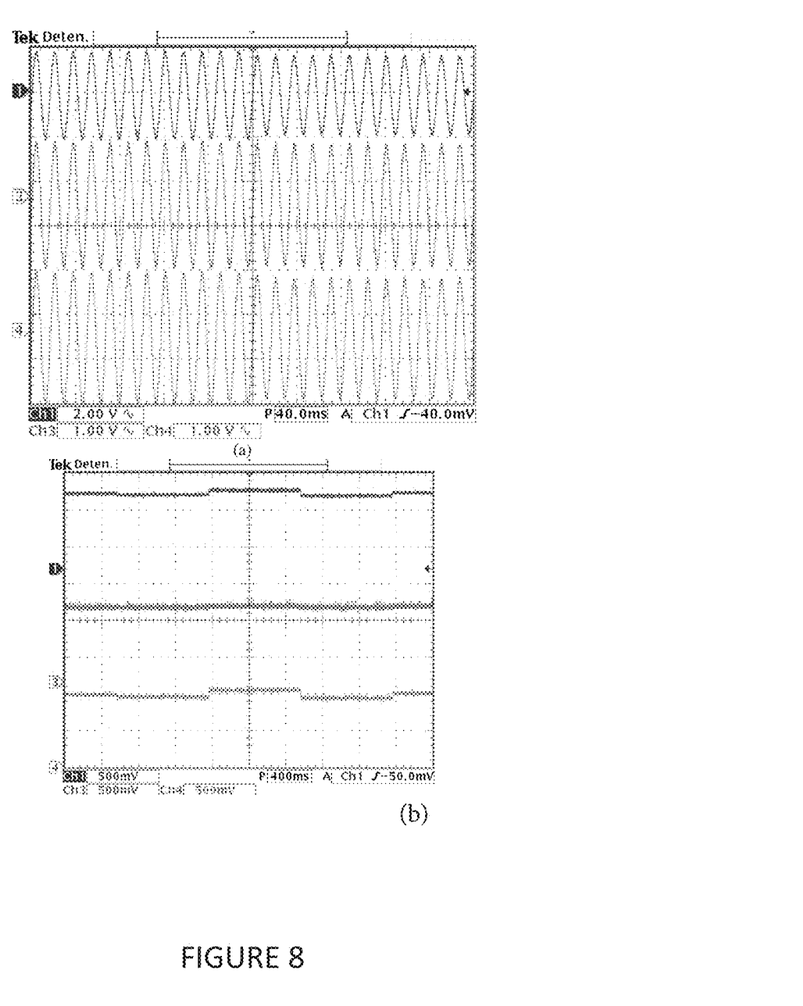
FIG. 8. Experimental response of LCO-FLL and SOGI-FLL before variations of amplitude of the reference within 88% 5≤V≤110%. (a) Ch1: Reference (2 V/div-40 ms/div), Ch3: LCO-FLL, Ch4: SOGI-FLL (1 V/div-40 ms/div). (b) RMS values, Ch1: Reference, Ch3: LCO-FLL, Ch4: SOGI-FLL (500 mV/div-400 ms/div).

In this test the robustness of the present invention is observed before variations of amplitude in the reference within the normal operating range of an electrical network defined in the IEEE 929 standard (88%≤V≤110%). In addition, the performance of the present invention is compared to SOGI-FLL. In FIG. 8 (a) it can be seen that the SOGI-FLL follows the amplitude variations of the reference, however, the LCO-FLL maintains its constant oscillation amplitude. The RMS values of the reference, LCO-FLL and SOGI-FLL, are shown in FIG. 8 (b). It is evident that the amplitude of the SOGI-FLL changes as the amplitude of the reference changes, however, the amplitude of the LCO-FLL remains constant before these changes of amplitude in the reference, which is important if the output of the LCO-FLL it is used as a reference for a controller.

Example 5

Experimental Evaluation of the Three-Phase LCO-FLL System.

Figure 9:
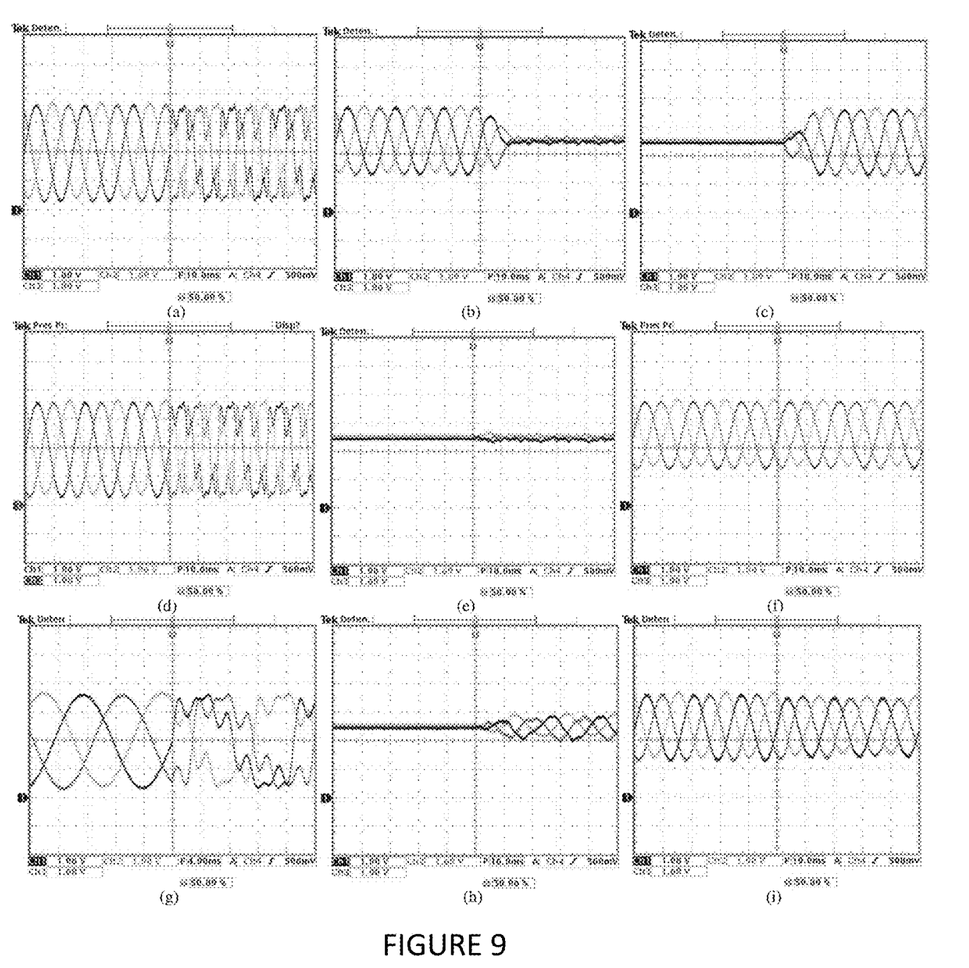

The three-phase structure of FIG. 3 is evaluated against changes in positive to negative sequence. The parameters for the two modules LCO-FLL are the same as in Table I. FIG. 9 (a) shows the two scenarios defined in Table II:

TABLE II

Scenarios for the input voltage of the network for FIG. 9 (a)

| Previous network failure | Network failure |
| --- | --- |
| Va = 1 ∠ 120° pu | $V_a$ = 1 ∠ 120° pu |
| $V_b$ = 1 ∠ 0° pu | $V_b$ = 1 ∠− 120° pu |
| $V_c$ = 1 ∠− 120° pu | $V_c$ = 1 ∠ 0° pu |
| Components without harmonics | Components with harmonics with a THD = 38.05% |

On the left side of FIG. 9 (a) is the scenario before the failure of the network, which is a balanced three-phase reference with positive sequence. The second scenario is the failure in the network shown to the right side of FIG. 9 (a), which is a three-phase contaminated reference and with a negative sequence.

FIGS. 9 (b) and (c) show the positive and negative sequences of the outputs of the structure of FIG. 3, respectively. The system detects the positive sequence in the scenario prior to the network failure, since the system is balanced, as can be seen in the left half of FIG. 9 (b). In the right half of FIGS. 9 (b) and (c) the absence of positive sequence and negative sequence detection, respectively, can be observed, due to the failure scenario of the network. The filtering characteristics can be observed on the right side of FIG. 9 (c) with a THD of 7.59% for each phase. Note that the system detects the transition between the two scenarios in less than half the voltage cycle of the network, despite the distorted voltage of the network at the input.

Example 6

The three-phase structure of FIG. 3 is evaluated against a contaminated three-phase reference without sequence changes in its components. FIG. 9 (d) shows two scenarios defined in Table III:

TABLE III

Scenarios for the input voltage of the network for FIG. 9 (d)

| Previous network failure | Network failure |
| --- | --- |
| Va = 1 ∠ 120° pu | $V_a$ = 1 ∠ 120° pu |
| $V_b$ = 1 ∠ 120° pu | $V_b$ = 1 ∠− 120° pu |
| $V_c$ = 1 ∠− 0° pu | $V_c$ = 1 ∠ 0° pu |
| Components without harmonics | Components with harmonics with a THD = 38.05% |

On the left side of FIG. 9 (d) is the scenario prior to the failure of the network, which is a balanced three-phase reference with negative sequence. The second scenario is the failure in the network shown on the right side of FIG. 9 (d), which is a contaminated three-phase reference and with the same negative sequence.

FIGS. 9 (e) and (f) show the positive and negative sequences of the outputs of the structure of FIG. 3, respectively. Despite the distorted input voltage, the system effectively detects the negative sequence and reduces the THD to 7.59%.

Example 7

The three-phase structure of FIG. 3 is evaluated against a three-phase contaminated and unbalanced reference without changes of sequence in its components. FIG. 9 (g) shows the scenarios defined in table IV:

TABLE IV

Scenarios for the input voltage of the network for FIG. 9 (g)

| Previous network failure | Network failure |
| --- | --- |
| Va = 1 ∠ 120° pu | $V_a$ = 1 ∠ 120° pu |
| $V_b$ = 1 ∠− 120° pu | $V_b$ = 1 ∠− 120° pu |
| $V_c$ = 1 ∠ 0° pu | $V_c$ = 1 ∠ 60° pu |
| Components without harmonics | Components with harmonics with a THD = 38.05% |

On the left side of FIG. 9 (g) is the scenario prior to the failure of the network, which is a balanced three-phase reference with negative sequence. The second scenario is the failure in the network shown on the right side of FIG. 9 (g), which is a three-phase contaminated and unbalanced reference and with the same negative sequence.

9 (h) and (i) show the positive and negative sequence of the outputs of FIG. 3, respectively. The system detects the negative sequence in the previous scenario of the network failure, as can be seen in the left half of FIG. 9 (*i*). In the right half of FIGS. 9 (*h*) and (*i*) an increase of the positive sequence and the reduction of the negative sequence, respectively, can be observed due to the failure of the network. The system detects an imbalance in less than half a voltage cycle, despite the distorted input signal.

Example 8

Method and System of Electric Energy Injection Using the Three-Phase LCO-FLL Synchronizer.

In this example, an electric power cogeneration system is described from a photovoltaic panel. In this case, the energy source is solar, which, through a photovoltaic panel, is transformed into electrical energy. This electrical energy is processed by a step-up converter, which conditions the input voltage to the three-phase inverter at a suitable level. The three-phase synchronizer LCO-FLL of the present invention processes the signals of three-phase voltages of the electric network to obtain references free of disturbances and harmonics, besides that it detects the sequences of the components va, vb and vc. This information is sent to the current control, which controls the three-phase inverter to inject three-phase current synchronized with the three-phase voltage signals of the electrical network. In this way it is ensured to inject active power into the electrical network.

Figure 10:
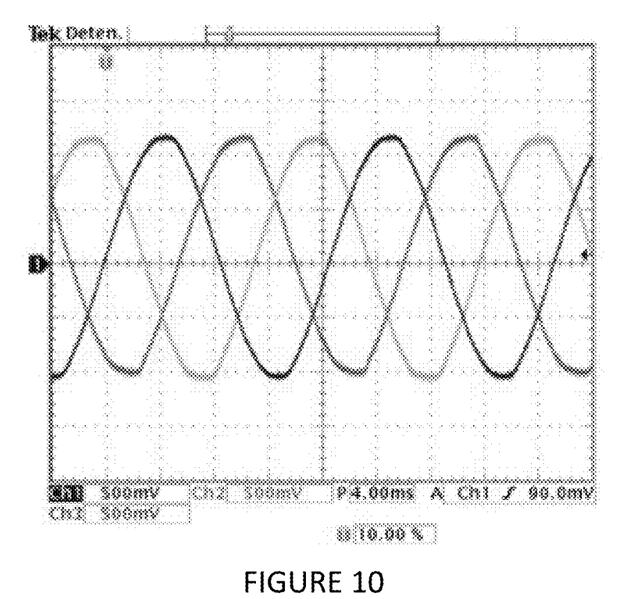
FIG. 10. Schematic of signals of the voltages of the electric network vabc.
Figure 11:
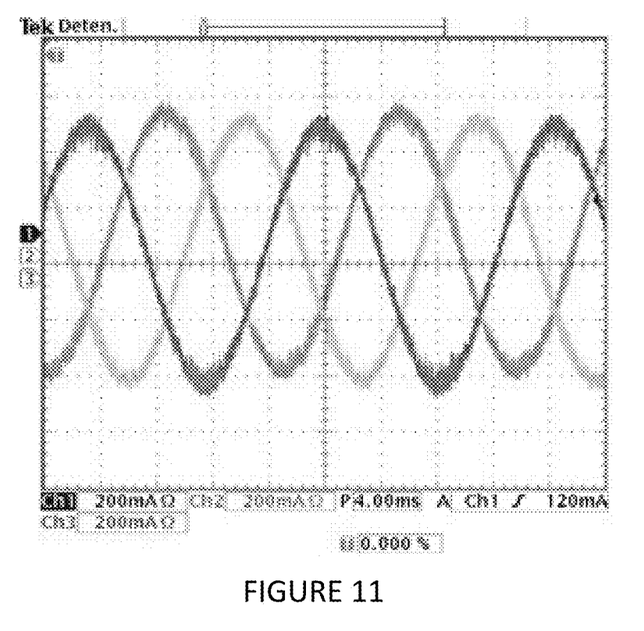
FIG. 11. Schematic of three-phase current injected into the electricity network iabc.

FIG. 10 shows the signals of three-phase voltages of the electrical network registered by the voltage sensors. These results serve as a basis to process the signals and create synchronized current references, as shown in FIG. 11, where the three-phase currents registered by the sensors, which are in frequency and phase with the three-phase voltage signals, ensure an injection of active power to the 250 W electrical network.

Example 9

Method and System of Electric Energy Injection Using the Single-Phase LCO-FLL Synchronizer.

In this example, an electric power cogeneration system is described from a photovoltaic panel. The system consists of a photovoltaic inverter, from which the maximum power obtained by an array of photovoltaic cells is extracted. This power is processed and injected into the power grid in the form of active power. In addition to injecting active power into the electrical network, it can compensate the reactive power and eliminate current harmonics generated by non-linear loads, reducing the harmonic contamination of the electric network and increasing the power factor. The synchronizer of the present invention is used to generate a reference of the single-phase voltage of the electrical network and to be able to inject active power reliably, efficiently and safely.

Figure 12:
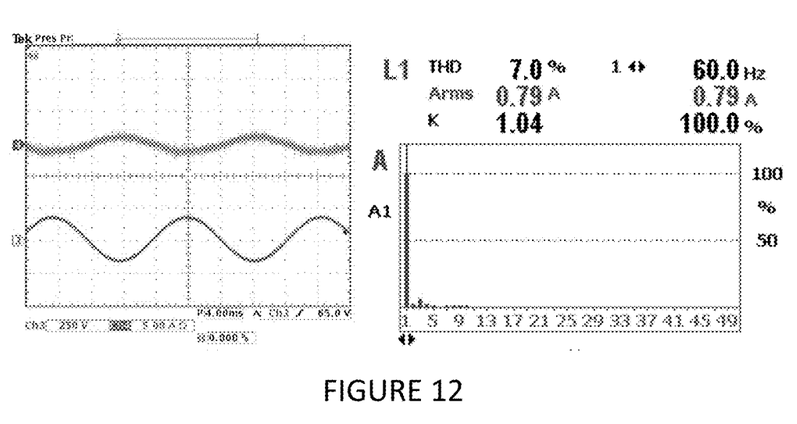
FIG. 12. Scheme of active power injection. (a) Synchronized current and voltage graph. (b) Harmonic content of injectable current.

FIG. 12 (*a*) shows the results corresponding to injection of active power. The power in the panel is 100 W. In the upper part the current injected by the system is observed and in the lower part the voltage of the single-phase network. FIG. 12 (*b*) shows the harmonic content of the injected electric current that has a THD of 7.0%, which is within the ranges allowed by international standards.

The invention claimed is:

1. A real-time synchronization system for power converters comprising:
  a clarke transformation module; and
  a clarke reverse transformation module comprises two modules; wherein each module of the two modules comprises at least two operating blocks, the two operating blocks are a limit cycle oscillator (LCO) and a frequency-locked loop (FLL) block, the LCO operably linked to the FLL block by using a feedback signal comprising information on a frequency and a phase of an input signal, wherein the LCO generates a sinusoidal signal synchronized to the input signal, wherein the FLL block keeps the LCO set to the frequency and the phase of the input signal.

2. The synchronization system according to claim 1, wherein the trajectories of the LCO states are pure sinusoids, thus creating free references of harmonics and disturbances of an electric network.

3. The synchronization system according to claim 1, wherein said input signal is triphasic.

4. The system according to claim 1, wherein the system estimates components of positive and negative sequence in a three-phase system in electrical networks contaminated with harmonics.

* * * * *